(12) United States Patent
Park et al.

(10) Patent No.: US 12,733,371 B2
(45) Date of Patent: Sep. 8, 2026

(54) DISPLAY DEVICE INCLUDING MULTI-LAYER MULTI-THICKNESS PIXEL ELECTRODES AND METHOD OF MANUFACTURING THE SAME

(71) Applicant: SAMSUNG DISPLAY CO., LTD., Yongin-si (KR)

(72) Inventors: Joonyong Park, Yongin-si (KR); Hyuneok Shin, Yongin-si (KR); Juhyun Lee, Yongin-si (KR); Yungbin Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 370 days.

(21) Appl. No.: 18/237,125

(22) Filed: Aug. 23, 2023

(65) Prior Publication Data

US 2024/0090304 A1 Mar. 14, 2024

(30) Foreign Application Priority Data

Sep. 8, 2022 (KR) ........................ 10-2022-0114493

(51) Int. Cl.
*H10K 59/80* (2023.01)
*H10K 59/12* (2023.01)
*H10K 102/00* (2023.01)

(52) U.S. Cl.
CPC ... *H10K 59/80517* (2023.02); *H10K 59/1201* (2023.02); *H10K 2102/351* (2023.02)

(58) Field of Classification Search
CPC ................. H10K 50/816; H10K 59/00; H10K 59/80517; H10K 59/1201; H10K 2102/351; H10K 50/805
See application file for complete search history.

(56) References Cited

U.S. PATENT DOCUMENTS 10,453,902 B2 10/2019 Lee et al.
2006/0091791 A1 5/2006 Shin
(Continued)

FOREIGN PATENT DOCUMENTS

KR 20060037857 A 5/2006
KR 1020110065856 6/2011
(Continued)

*Primary Examiner* — Ratisha Mehta
*Assistant Examiner* — Brad A Knudson
(74) *Attorney, Agent, or Firm* — CANTOR COLBURN LLP

(57) ABSTRACT

A display device includes a substrate, a pixel circuit layer disposed on the substrate and including a thin-film transistor, a first pixel electrode disposed on the pixel circuit layer, and including a first lower layer, a first intermediate layer and a first upper layer, a second pixel electrode disposed on the pixel circuit layer, and including a second lower layer, a second intermediate layer and a second upper layer, an opposite electrode disposed on the first pixel electrode and the second pixel electrode, a first emission layer disposed between the first pixel electrode and the opposite electrode, and a second emission layer disposed between the second pixel electrode and the opposite electrode, where a thickness of the first upper layer is greater than a thickness of the second upper layer, and the first upper layer includes an amorphous metal material.

19 Claims, 10 Drawing Sheets

(56) References Cited

U.S. PATENT DOCUMENTS

| | | | | |
|---|---|---|---|---|
| 2007/0015429 | A1* | 1/2007 | Maeda | H10K 59/80517 313/506 |
| 2011/0102722 | A1* | 5/2011 | Kang | C23C 14/3414 349/139 |
| 2011/0241000 | A1 | 10/2011 | Choi et al. | |
| 2016/0240733 | A1* | 8/2016 | Park | H10H 20/815 |
| 2016/0336381 | A1* | 11/2016 | Won | H10K 59/351 |
| 2017/0271414 | A1 | 9/2017 | Ohsawa et al. | |
| 2019/0148457 | A1* | 5/2019 | Lee | H10K 39/32 257/40 |
| 2022/0100318 | A1* | 3/2022 | Wang | G06F 3/0412 |
| 2025/0143072 | A1* | 5/2025 | Muir | H10K 50/82 |
| 2025/0157401 | A1* | 5/2025 | Long | G09G 3/3233 |

FOREIGN PATENT DOCUMENTS

| | | | |
|---|---|---|---|
| KR | 20110109048 | A | 10/2011 |
| KR | 1020140087813 | | 7/2014 |
| KR | 20160134918 | A | 11/2016 |
| KR | 1020180078641 | | 7/2018 |
| KR | 20190034791 | A | 4/2019 |

* cited by examiner

210c'
211c 212c 213c' PR2
210b'
211b 212b 213b' PR2
210a
211a 212a 213a PR1
116
115
113
111
PCL
100
SE GE Act DE
TFT
TFT
Z
X

FIG. 5D 210a 211a 212a 213a PR1
210b' 211b 212b 213b'
210c' 211c 212c 213c'
PCL 116 115 113 111 100
SE GE Act DE TFT
TFT
Z X

DISPLAY DEVICE INCLUDING MULTI-LAYER MULTI-THICKNESS PIXEL ELECTRODES AND METHOD OF MANUFACTURING THE SAME

This application claims priority to Korean Patent Application No. 10-2022-0114493, filed on Sep. 8, 2022, and all the benefits accruing therefrom under 35 U.S.C. § 119, the content of which in its entirety is herein incorporated by reference.

BACKGROUND

1. Field

One or more embodiments relate to a display device and a method of manufacturing the display device.

2. Description of the Related Art

Display devices display data visually. Display devices are used as display portions of compact products such as mobile phones or large-sized products such as televisions.

A display device typically includes a plurality of pixels which receives an electrical signal and emits light to display an image to the outside. Each pixel may include a light-emitting element. For example, an organic light-emitting display device may include an organic light-emitting diode (OLED) as a light-emitting element. In general, an organic light-emitting display device includes a thin-film transistor and an organic light-emitting diode formed on a substrate, and operates according to the organic light-emitting diode that emits light by itself.

As the usage of display devices has recently been diversified, various attempts for designing display devices with improved quality have been tried.

SUMMARY

One or more embodiments include a display device with improved reliability. One or more embodiments include a method of manufacturing a display device with reduced manufacturing costs due to process simplification.

According to one or more embodiments, a display device includes a substrate, a pixel circuit layer disposed on the substrate and including a thin-film transistor, a first pixel electrode disposed on the pixel circuit layer, and including a first lower layer, a first intermediate layer and a first upper layer, a second pixel electrode disposed on the pixel circuit layer, and including a second lower layer, a second intermediate layer and a second upper layer, an opposite electrode disposed on the first pixel electrode and the second pixel electrode, a first emission layer disposed between the first pixel electrode and the opposite electrode, and a second emission layer disposed between the second pixel electrode and the opposite electrode, where a thickness of the first upper layer is greater than a thickness of the second upper layer, and the first upper layer includes an amorphous metal material.

In an embodiment, the amorphous metal material may include zinc-doped indium tin oxide (Zn-doped ITO).

In an embodiment, in the Zn-doped ITO, an atomic ratio of tin (Sn) may be in a range of about 15 atomic percent (at %) to about 25 at %, and a composition ratio of indium (In) to zinc (Zn) may be about 1:1.

In an embodiment, the amorphous metal material may have an amorphous state at a temperature of 250° C. or less.

In an embodiment, the second upper layer may include a same material as a material of the first upper layer, and the second lower layer may include a same material as a material of the first lower layer.

In an embodiment, the first lower layer may include the amorphous metal material.

In an embodiment, the thickness of the first upper layer may be greater than a thickness of the first lower layer.

In an embodiment, a thickness of the first lower layer may be equal to a thickness of the second lower layer.

In an embodiment, the thickness of the first upper layer may be in a range of about 500 angstroms (Å) to about 2000 Å.

In an embodiment, a thickness of the first lower layer may be in a range of about 50 Å to about 200 Å.

In an embodiment, a thickness of the cured layer may be in a range of about 100 Å to about 500 Å.

According to one or more embodiments, a display device includes a substrate, a pixel circuit layer disposed on the substrate and including a thin-film transistor, a first pixel electrode and a second pixel electrode which are disposed on the pixel circuit layer, where the first pixel electrode has a first thickness and the second pixel electrode has a second thickness less than the first thickness, an opposite electrode on the first pixel electrode and the second pixel electrode, and a first emission layer disposed between the first pixel electrode and the opposite electrode, and a second emission layer disposed between the second pixel electrode and the opposite electrode, where each of the first pixel electrode and the second pixel electrode includes an amorphous metal material.

In an embodiment, the amorphous metal material may include Zn-doped ITO.

In an embodiment, in the Zn-doped ITO, an atomic ratio of tin (Sn) may be in a range of about 15 at % to about 25 at %, and a composition ratio of indium (In) to zinc (Zn) may be about 1:1.

In an embodiment, each of the first pixel electrode and the second pixel electrode may include a lower layer, an intermediate layer disposed on the lower layer and including silver (Ag), and an upper layer disposed on the intermediate layer and including the amorphous metal material.

In an embodiment, a thickness of the upper layer of the first pixel electrode may be greater than a thickness of the upper layer of the second pixel electrode.

According to one or more embodiments, a method of manufacturing a display device, includes forming a lower conductive layer on a substrate, an intermediate conductive layer on the lower conductive layer, and an upper conductive layer on the intermediate conductive layer, where the upper conductive layer is thicker than the lower conductive layer, forming a first photoresist pattern and a second photoresist pattern on the upper conductive layer, where the second photoresist pattern has a less thickness than the first photoresist pattern, forming a first pixel electrode and a preliminary pixel electrode by etching the lower conductive layer, the intermediate conductive layer, and the upper conductive layer using the first photoresist pattern and the second photoresist pattern as a mask, where the first pixel electrode includes a first lower layer defined by a portion of the lower conductive layer, a first intermediate layer defined by a portion of the intermediate conductive layer, and a first upper layer defined by a portion of the upper conductive layer, and a preliminary pixel electrode includes a second lower layer defined by a portion of the lower conductive layer, a second intermediate layer defined by a portion of the intermediate conductive layer, and a preliminary upper layer defined by a portion of the upper conductive layer, removing a partial portion of the first photoresist pattern, and an entire portion the second photoresist pattern, forming a second pixel electrode by partially etching the preliminary upper layer of the preliminary pixel electrode, and removing a remaining portion of the first photoresist pattern.

In an embodiment, the upper conductive layer may include an amorphous metal material.

In an embodiment, the upper conductive layer may include Zn-doped ITO.

In an embodiment, in the Zn-doped ITO, an atomic ratio of tin (Sn) may be in a range of about 15 at % to about 25 at %, and a composition ratio of indium (In) to zinc (Zn) may be about 1:1.

BRIEF DESCRIPTION OF THE DRAWINGS

The above and other features of certain embodiments of the disclosure will be more apparent from the following description taken in conjunction with the accompanying drawings, in which:

FIG. 3 is a cross-sectional view schematically illustrating a display device according to an embodiment;

FIGS. 5A to 5F are schematic cross-sectional views showing a method of manufacturing a display device, according to an embodiment.

DETAILED DESCRIPTION

Figure 1:
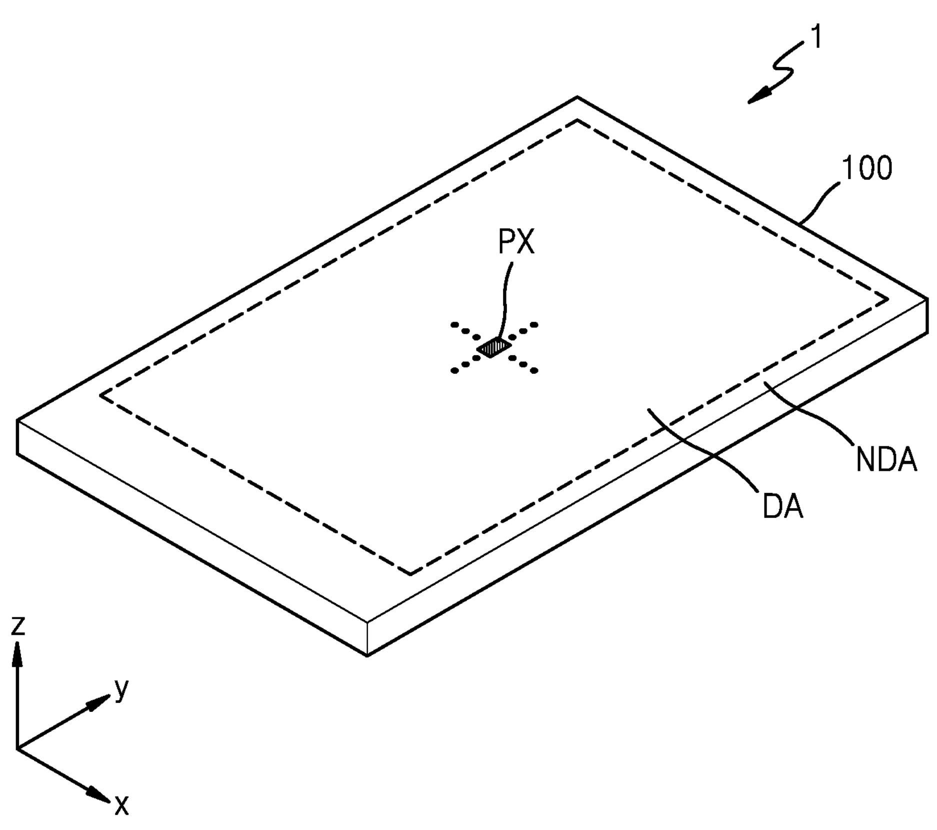
FIG. 1 is a perspective view schematically illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As used herein, the term "and/or" includes any and all combinations of one or more of the associated listed items. "Or" means "and/or." Throughout the disclosure, the expression "at least one of a, b and c" or "at least one selected from a, b and c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The effects and features of the disclosure, and ways to achieve them will become apparent by referring to embodiments that will be described later in detail with reference to the drawings. However, the disclosure is not limited to the following embodiments but may be embodied in various forms.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the embodiments below, it will be understood when a portion such as a layer, an area, or an element is referred to as being "on" or "above" another portion, it can be directly on or above the other portion, or intervening portion may also be present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

When an embodiment is implementable in another manner, a predetermined process order may be different from a described one. For example, two processes that are consecutively described may be substantially simultaneously performed or may be performed in an opposite order to the described order.

In embodiments herein, when layers, regions, or elements are described as being connected, this indicates not only a case where layers, regions, and elements are directly connected but also a case where layers, regions, and elements are indirectly connected with other layers, regions, and elements therebetween. For example, herein, when layers, regions, or elements are described as being electrically connected, this indicates not only a case where layers, regions, and elements are directly electrically connected but also a case where layers, regions, and elements are indirectly electrically connected with other layers, regions, and elements therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings, and in the description with reference to the drawings, like reference numerals refer to like elements and any repetitive detailed descriptions thereof will be omitted.

A display device is a device for displaying an image, and may be a portable or mobile electronic device such as a game player, a multi-media device, ultra-compact personal computer (PC). A display device to be described later may include a liquid crystal display, an electrophoretic display, an organic light-emitting display, an inorganic electro-luminescent (EL) display, a field emission display, a surface-conduction electron-emitter display, a quantum dot display, a plasma display, a cathode ray display, or the like. Hereinafter, for convenience of description, embodiments where the display device is an organic light-emitting diode display will be described in detail, but the display device may be one of other various types of display devices as described above in embodiments of the disclosure.

FIG. 1 is a perspective view schematically illustrating a display device 1 according to an embodiment.

Referring to FIG. 1, an embodiment of the display device 1 may include a display area DA and a non-display area NDA on a substrate 100.

The display area DA may realize an image. Pixels PX may be arranged in the display area DA. An image may be provided using light emitted from the pixels PX.

The non-display area NDA is an area where no image is provided, and no pixels PX are arranged therein. The non-display area NDA may entirely surround the display area DA. In the non-display area NDA, for example, a driver for providing an electrical signal or power to the pixels PX, may be arranged. The non-display area NDA may include a pad portion (not shown) which is an area to which an electronic element or a printed circuit board or the like may be electrically connected.

Figure 2:
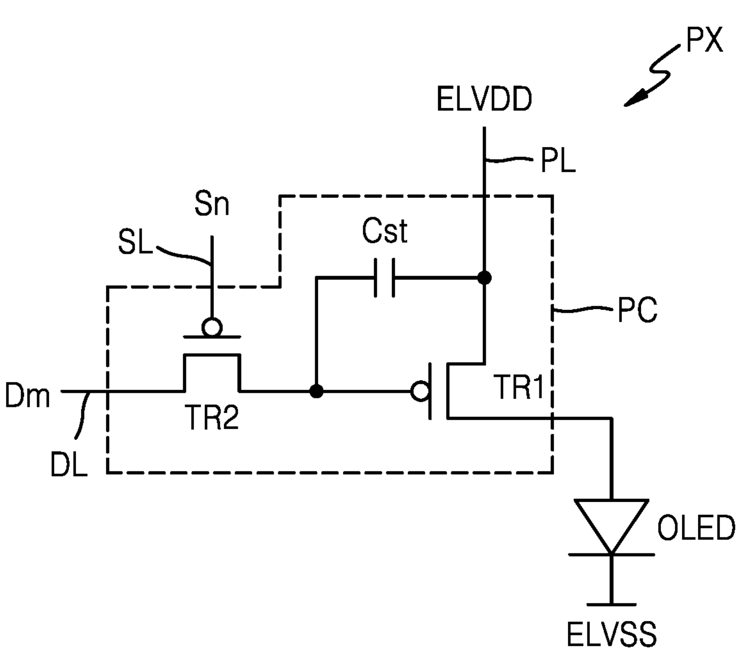
FIG. 2 is an equivalent circuit diagram of a pixel included in a display device, according to an embodiment.

FIG. 2 is an equivalent circuit diagram of a pixel PX included in a display device, according to an embodiment.

Referring to FIG. 2, in an embodiment, the pixel PX may include a pixel circuit PC, and a display element connected to the pixel circuit PC, for example, an organic light-emitting diode OLED. The pixel circuit PC may include a first thin-film transistor TR1, a second thin-film transistor TR2, and a storage capacitor Cst. Each pixel PX may emit, for example, red, green, or blue light through the organic light-emitting diode OLED thereof.

The second thin-film transistor TR2 is a switching thin-film transistor, and is connected to a scan line SL and a data line DL, and may be configured to transfer, to the first thin-film transistor TR1, a data voltage or a data signal Dm input from the data line DL based on a switching voltage or a switching signal Sn input from the scan line SL. The storage capacitor Cst may be connected to the second thin-film transistor TR2 and a driving voltage line PL, and store a voltage corresponding to a difference between a voltage received from the second thin-film transistor TR2 and a first power voltage ELVDD supplied to the driving voltage line PL.

The first thin-film transistor TR1 is a driving thin-film transistor, and may be connected to the driving voltage line PL and the storage capacitor Cst, and may control, in response to a voltage value stored in the storage capacitor Cst, a driving current flowing from the driving voltage line PL and through the organic light-emitting diode OLED. The organic light-emitting diode OLED may emit light having a certain luminance, corresponding to the driving current. An opposite electrode (e.g., a cathode) of the organic light-emitting diode OLED may receive a second power voltage ELVSS.

FIG. 2 illustrates an embodiment where the pixel circuit PC includes two thin-film transistors and a single storage capacitor, but not being limited thereto. In embodiments, the number of thin-film transistors and the number of storage capacitors may be modified in various manners according to the design of the pixel circuit PC.

Figure 3:
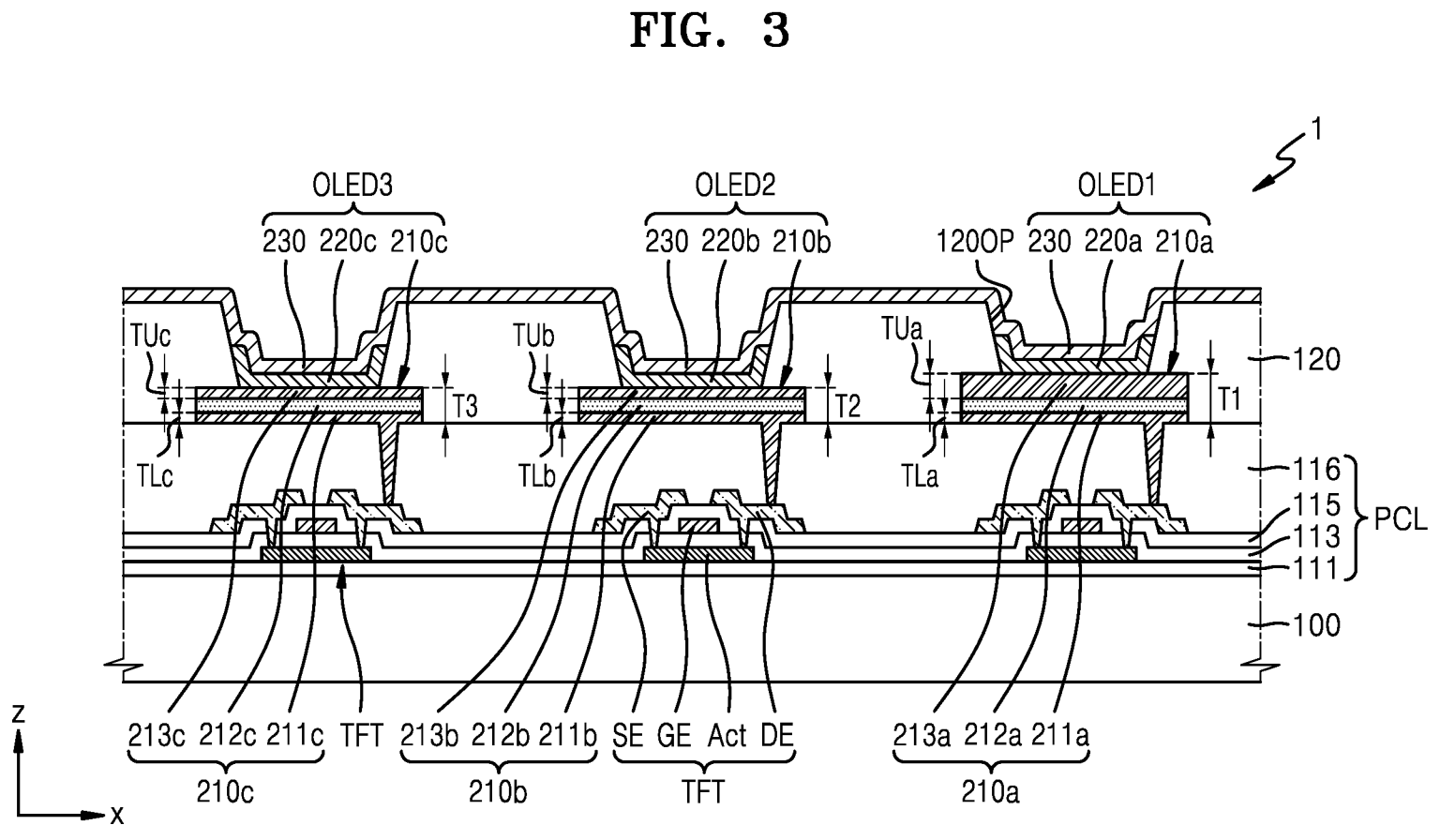

FIG. 3 is a cross-sectional view schematically illustrating the display device 1 according to an embodiment.

Referring to FIG. 3, an embodiment of the display device 1 may include the substrate 100, a pixel circuit layer PCL on the substrate 100, and first to third organic light-emitting diodes OLED1, OLED2, and OLED3 on the pixel circuit layer PCL. The first organic light-emitting diode OLED1 may include a first pixel electrode 210*a*, a first emission layer 220*a*, and an opposite electrode 230. The second organic light-emitting diode OLED2 may include a second pixel electrode 210*b*, a second emission layer 220*b*, and the opposite electrode 230. The third organic light-emitting diode OLED3 may include a third pixel electrode 210*c*, a third emission layer 220*c*, and the opposite electrode 230. The first to third organic light-emitting diodes OLED1 to OLED3 may emit light of different colors from each other. The first organic light-emitting diode OLED1 to the third organic light-emitting diode OLED3 may emit red, green, or blue light. In an embodiment, for example, the first organic light-emitting diode OLED1 may emit blue light, the second organic light-emitting diode OLED2 may emit green light, and the third organic light-emitting diode OLED3 may emit red light, but are not limited thereto. The colors emitted by each organic light-emitting diode may be variously modified.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate (TAC), or cellulose acetate propionate.

The pixel circuit layer PCL may be disposed on the substrate 100. The pixel circuit layer PCL may include a pixel circuit and insulating layers connected to the organic light-emitting diode. The pixel circuit layer PCL may include at least one thin-film transistor TFT and a plurality of insulating layers 111, 113, 115, and 116 disposed on the substrate 100.

A buffer layer 111 may be arranged between the substrate 100 and the thin-film transistor TFT. The buffer layer 111 may include an inorganic insulation material such as silicon nitride, silicon oxynitride, and silicon oxide, and may be provided as a single layer or multiple layers, that is, have a single-layer structure or a multi-layer structure, each layer therein including at least one selected from the above-described inorganic insulation materials.

The thin-film transistor TFT may include a semiconductor layer Act, and the semiconductor layer Act may include polysilicon, amorphous silicon, an oxide semiconductor, or an organic semiconductor. The semiconductor layer Act may include a channel region, and a drain region and a source region respectively arranged on opposing sides of the channel region.

A gate electrode GE may be disposed on the semiconductor layer Act, and the gate electrode GE may include a low-resistance metal material. The gate electrode GE may include a conductive material including molybdenum (Mo), aluminum (Al), copper (Cu), titanium (Ti), or the like, and may have a single-layer structure or a multi-layer structure, each layer therein including at least one selected from the above materials.

A gate insulating layer 113 between the semiconductor layer Act and the gate electrode GE may include an inorganic insulation material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An interlayer insulating layer 115 may be disposed on the gate electrode GE, and the interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may have a single-layer structure or a multi-layer structure, each layer therein including at least one selected from the above-described inorganic insulation materials.

The drain electrode DE and the source electrode SE may be positioned on the interlayer insulating layer 115. The drain electrode DE and the source electrode SE may be respectively connected to the drain region and the source region of the semiconductor layer Act through contact holes defined or formed in the gate insulating layer 113 and the interlayer insulating layer 115. The drain electrode DE and the source electrode SE may include a material having high conductivity. The drain electrode DE and the source electrode SE may include a conductive material including molybdenum (Mo), aluminum (Al), copper (Cu), titanium (Ti), and the like, and may have a single-layer structure or a multi-layer structure, each layer therein including at least one selected from the above materials. In an embodiment, the drain electrode DE and the source electrode SE may have a multi-layer structure of Ti/Al/Ti.

A via insulating layer 116 covering the thin-film transistor TFT may be disposed on the interlayer insulating layer 115. The via insulating layer 116 includes an organic insulation material, and may include, for example, a general-purpose polymer such as polymethylmethacrylate (PMMA) or polystyrene (PS), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, or a combination thereof.

The first to third pixel electrodes 210a, 210b, and 210c and a pixel-defining layer 120 may be disposed on the pixel circuit layer PCL. An opening 120OP may be defined through the pixel-defining layer 120 to expose at least a portion of each of the first to third pixel electrodes 210a, 210b, and 210c. That is, at least a portion of surfaces of the first to third pixel electrodes 210a, 210b, and 210c may be exposed by the opening 120OP defined in the pixel-defining layer 120. In an embodiment, a region exposed by the opening 120OP of the pixel-defining layer 120 may be defined as an emission region. The pixel-defining layer 120 may include an organic insulation material and/or an inorganic insulation material.

The first to third pixel electrodes 210a, 210b, and 210c may be electrically connected to a circuit unit such as the thin-film transistor TFT included in the pixel circuit layer PCL through a via hole defined or formed in the via insulating layer 116.

The first to third pixel electrodes 210a, 210b, and 210c may each include a lower layer, an intermediate layer on the lower layer, and an upper layer on the intermediate layer. The first pixel electrode 210a may include a first lower layer 211a on the pixel circuit layer PCL, a first intermediate layer 212a on the first lower layer 211a, and a first upper layer 213a on the first intermediate layer 212a. The second pixel electrode 210b may include a second lower layer 211b on the pixel circuit layer PCL, a second intermediate layer 212b on the second lower layer 211b, and a second upper layer 213b on the second intermediate layer 212b. The third pixel electrode 210c may include a third lower layer 211c on the pixel circuit layer PCL, a third intermediate layer 212c on the third lower layer 211c, and a third upper layer 213c on the third intermediate layer 212c.

The first pixel electrode 210a may have a first thickness T1, and the second pixel electrode 210b may have a second thickness T2 less than the first thickness T1. That is, the thickness T1 of the first pixel electrode 210a may be greater than the thickness T2 of the second pixel electrode 210b. The thickness T1 of the first pixel electrode 210a may be greater than a thickness T3 of the third pixel electrode 210c.

A thickness TLa of the first lower layer 211a may be substantially equal to a thickness TLb of the second lower layer 211b. The thickness TLa of the first lower layer 211a may be substantially equal to a thickness TLc of the third lower layer 211c. The thickness TLb of the second lower layer 211b may be substantially equal to the thickness TLc of the third lower layer 211c. The thicknesses TLa, TLb, and TLc of the first lower layer 211a, the second lower layer 211b, and the third lower layer 211c may be substantially equal to each other. In an embodiment, the thickness TLa of the first lower layer 211a may be in a range of about 50 angstroms (Å) to about 200 Å.

The first lower layer 211a, the second lower layer 211b, and the third lower layer 211c may include a same material as each other. As will be described later with reference to FIGS. 5A to 5C, the first lower layer 211a, the second lower layer 211b, and the third lower layer 211c are formed in a same process using a same material, and thus may include the same material as each other. The first lower layer 211a may include a same material as the first upper layer 213a. The second lower layer 211b may include a same material as the second upper layer 213b. The third lower layer 211c may include a same material as the third upper layer 213c.

In an embodiment, each of the first lower layer 211_a_, the second lower layer 211_b_, and the third lower layer 211_c_ may include an amorphous metal material. Each of the first lower layer 211_a_, the second lower layer 211_b_, and the third lower layer 211_c_ may include a metal material having an amorphous state at a temperature of about 250° C. or less. In an embodiment, for example, each of the first lower layer 211_a_, the second lower layer 211_b_, and the third lower layer 211_c_ may include zinc-doped indium tin oxide (Zn-doped ITO). In an embodiment, in the Zn-doped ITO, a composition of indium (In), tin (Sn), and zinc (Zn) may be a composition having amorphous properties. In an embodiment, in the Zn-doped ITO, an atomic ratio of tin (Sn) may be in a range of about 15 atomic percent (at %) to about 25 at %, and a composition ratio of indium (In) to zinc (Zn) may be about 1:1.

The first intermediate layer 212_a_ may be disposed between the first lower layer 211_a_ and the first upper layer 213_a_. The second intermediate layer 212_b_ may be disposed between the second lower layer 211_b_ and the second upper layer 213_b_. The third intermediate layer 212_c_ may be disposed between the third lower layer 211_c_ and the third upper layer 213_c_.

As described with reference to FIGS. 5A to 5C, the first intermediate layer 212_a_, the second intermediate layer 212_b_, and the third intermediate layer 212_c_ are formed in a same process using a same material, and thus may include the same material as each other. The first intermediate layer 212_a_, the second intermediate layer 212_b_, and the third intermediate layer 212_c_ may include silver (Ag), magnesium (Mg), aluminum (Al), platinum (Pt), palladium (Pd), gold (Au), nickel (Ni), neodymium (Nd), iridium (Ir), chromium (Cr), or a compound thereof.

A thickness TUa of the first upper layer 213_a_ may be greater than a thickness TUb of the second upper layer 213_b_. The thickness TUa of the first upper layer 213_a_ may be greater than a thickness TUc of the third upper layer 213_c_. The thickness TUa of the first upper layer 213_a_ may be in a range of about 500 Å to about 2000 Å. If the thickness TUa of the first upper layer 213_a_ is greater than the above range, i.e., greater than about 2000 Å, the forming process thereof may not be easy. If the thickness TUa of the first upper layer 213_a_ is less than the above range, i.e., less than about 500 Å, it may be difficult to secure an appropriate resonance distance, and thus the manufacturing process may not be effectively simplified by reducing the number of fine metal mask (FMM) processes. The thickness TUb of the second upper layer 213_b_ may be in a range of about 50 Å to about 200 Å. The thickness TUc of the third upper layer 213_c_ may be in a range of about 50 Å to about 200 Å. If the thicknesses TUb of the second upper layer 213_b_ and the thickness TUc of the third upper layer 213_c_ are each greater than the above range, i.e., greater than about 200 Å, it may be difficult to secure an appropriate resonance distance. If the thicknesses TUb of the second upper layer 213_b_ and the thickness TUc of the third upper layer 213_c_ are less than the above range, i.e., less than about 50 Å, the forming process thereof may not be easy.

In an embodiment, the thickness TUa of the first upper layer 213_a_ may be relatively thick, such that a distance between the first intermediate layer 212_a_ and the opposite electrode 230 may be adjusted to thereby improve the display device quality. In such an embodiment where the thickness TUa of the first upper layer 213_a_ is relatively thick, the number of FMM processes may be reduced. Accordingly, an embodiment of the display device 1 may be used as an ultra-high resolution display device of 1600 pixels per inch (ppi) or more, for example, a display device for virtual reality (VR) or augmented reality (AR), may be provided. However, the use of embodiments of the display device according to the disclosure is not limited thereto.

The first upper layer 213_a_ may include an amorphous metal material. The first upper layer 213_a_ may include a metal material having an amorphous state at a temperature of about 250° C. or less. The first upper layer 213_a_ may include, for example, Zn-doped ITO in an amorphous state. In an embodiment, in the Zn-doped ITO, a composition of indium (In), tin (Sn), and zinc (Zn) may be a composition having amorphous properties. In an embodiment, in the Zn-doped ITO, an atomic ratio of tin (Sn) may be in a range of about 15 at % to about 25 at %, and a composition ratio of indium (In) to zinc (Zn) may be about 1:1. In an embodiment, in the Zn-doped ITO, the atomic ratio of tin (Sn) may be in a range of about 18 at % to about 20 at %, and the composition ratio of indium (In) to zinc (Zn) may be about 1:1. The Zn-doped ITO satisfying the above conditions may have an amorphous state at about 250° C. as described with reference to FIG. 4. Zn-doped ITO not satisfying the above conditions does not have an amorphous state, and thus the manufacturing process may not be effectively simplified by reducing the number of FMM mask processes.

As the first upper layer 213_a_ includes an amorphous metal material as described above, even when the first upper layer 213_a_ is thicker than the second upper layer 213_b_ or the third upper layer 213_c_, the occurrence of etching residues in an etching process for forming a pixel electrode may be effectively prevented or substantially reduced.

As will be described later with reference to FIGS. 5A to 5F, the first upper layer 213_a_, the second upper layer 213_b_, and the third upper layer 213_c_ are formed on a same conductive layer by performing subsequent processes, and thus may include the same material as each other. The second upper layer 213_b_ may include a same material as the third upper layer 213_c_. The second upper layer 213_b_ and the third upper layer 213_c_ may include, for example, Zn-doped ITO in an amorphous state.

The first upper layer 213_a_ disposed on the first intermediate layer 212_a_ may be defined by a single layer including or formed of a single material. In the disclosure, as the first pixel electrode 210_a_ is formed by adjusting the thickness of the first upper layer 213_a_, which is a single layer, the processes may be simplified compared to a case where the first upper layer 213_a_ is formed as a plurality of layers, thereby simplifying the processes and reducing the process cost.

In an embodiment, the third pixel electrode 210_c_ may have a same structure as the second pixel electrode 210_b_, and the features thereof is also similar to that of the second pixel electrode 210_b_, but is not limited thereto. Also, according to embodiments, the third pixel electrode 210_c_ may be modified to have a same structure as the first pixel electrode 210_a_.

The first, second, and third emission layers 220_a_, 220_b_, and 220_c_ may be provided or formed to correspond to the first to third pixel electrodes 210_a_, 210_b_, and 210_c_, respectively. The first emission layer 220_a_ may be disposed between the first pixel electrode 210_a_ and the opposite electrode 230. The second emission layer 220_b_ may be disposed between the second pixel electrode 210_b_ and the opposite electrode 230. The third emission layer 220_c_ may be disposed between the third pixel electrode 210_c_ and the opposite electrode 230. The first, second, and third emission layers 220_a_, 220_b_, and 220_c_ may each emit light of a certain color. In an embodiment, an emission layer may include a polymer or a low-molecular weight organic material. That is, the first, second, and third emission layers 220*a*, 220*b*, and 220*c* may include an organic emission layer. In an alternative embodiment, the first, second, and third emission layers 220*a*, 220*b*, and 220*c* may include an inorganic light-emitting material or quantum dots.

A first functional layer (not shown) and a second functional layer (not shown) may be disposed on or under each of the first, second, and third emission layers 220*a*, 220*b*, and 220*c*. The first functional layer may include, for example, a hole transport layer (HTL) or an HTL and a hole injection layer (HIL). The second functional layer is a component disposed on the first, second, and third emission layers 220*a*, 220*b*, and 220*c* and may include an electron transport layer (ETL) and/or an electron injection layer (EIL). The first functional layer and/or the second functional layer may be a common layer formed to completely cover the substrate 100, like the opposite electrode 230 to be described later.

The opposite electrode 230 may be disposed on the first to third pixel electrodes 210*a*, 210*b*, and 210*c* and overlap the first to third pixel electrodes 210*a*, 210*b*, and 210*c*. The opposite electrode 230 may include a conductive material having a low work function. In an embodiment, for example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Cu) or an alloy thereof. Alternatively, the opposite electrode 230 may further include a layer such as ITO, IZO, ZnO or $In_2O_3$ on the (semi)transparent layer including the above-described material. The opposite electrode 230 may be formed as a single unitary body to entirely cover the substrate 100.

Figure 4:
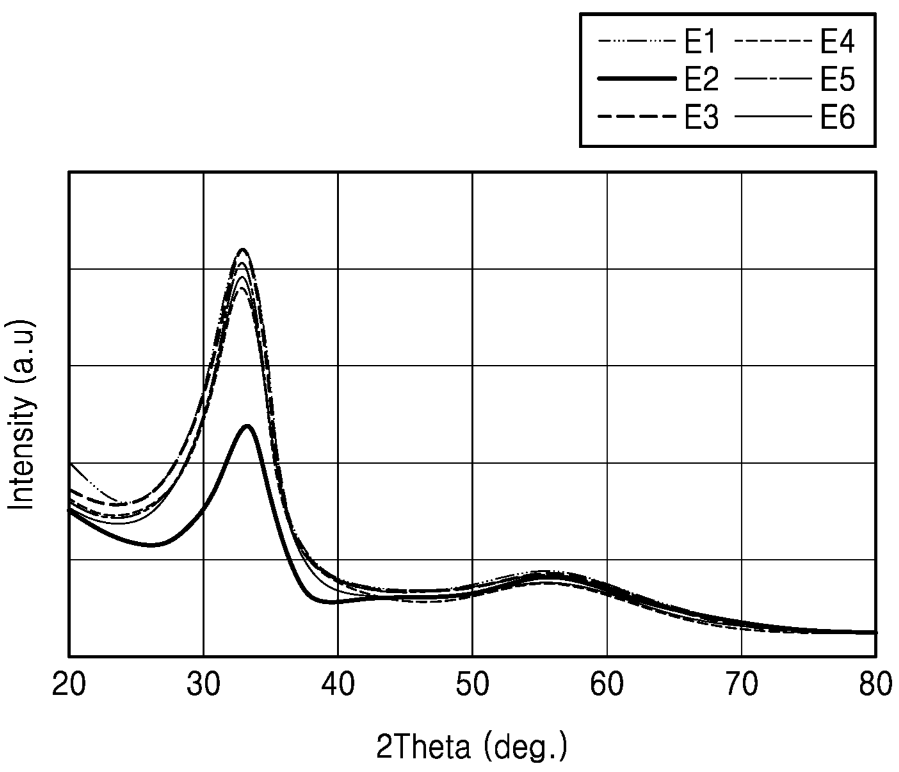
FIG. 4 is an analysis graph of X-ray diffraction (XRD) of a Zn-doped indium tin oxide (ITO)

FIG. 4 is an analysis graph of X-ray diffraction (XRD) of a Zn-doped ITO. In detail, FIG. 4 is an XRD analysis graph of Zn-doped ITO specimens having an atomic ratio of tin (Sn) in a range of 18 at % to 22 at % and a composition ratio of indium (In) to zinc (Zn) of 1:1 at about 250° C. Referring to the graph of FIG. 4, it can be confirmed no crystal peak appears at about 250° C. The first experimental example E1 is a specimen that has been heat treated, and has an atomic ratio of tin(Sn) of 18 at % and a composition ratio of indium (In) to zinc (Zn) of 1:1. The second experimental example E2 is a specimen that has been heat treated, and has an atomic ratio of tin(Sn) of 20 at % and a composition ratio of indium (In) to zinc (Zn) of 1:1. The third experimental example E3 is a specimen that has been heat treated, and has an atomic ratio of tin(Sn) of 22 at % and a composition ratio of indium (In) to zinc (Zn) of 1:1. The fourth experimental example E4 is a specimen that has not been heat treated, and has an atomic ratio of tin(Sn) of 18 at % and a composition ratio of indium (In) to zinc (Zn) of 1:1. The fifth experimental example E5 is a specimen that has not been heat treated, and has an atomic ratio of tin(Sn) of 20 at % and a composition ratio of indium (In) to zinc (Zn) of 1:1. The sixth experimental example E6 is a specimen that has not been heat treated, and has an atomic ratio of tin(Sn) of 22 at % and a composition ratio of indium (In) to zinc (Zn) of 1:1. As a process of forming pixel electrodes is performed at a temperature of 250° C. or less, in an embodiment where an upper layer of the pixel electrodes is formed of Zn-doped ITO having the above composition, the upper layer may include an amorphous metal layer. In such an embodiment, as the upper layer of the pixel electrode includes an amorphous metal layer, the occurrence of etching residues may be effectively prevented or substantially reduced even when the upper layer has a relatively thick thickness, thus increasing the reliability of a display device.

FIGS. 5A to 5F are schematic cross-sectional views showing a method of manufacturing a display device, according to an embodiment. FIGS. 5A to 5F illustrate respective operations of the method of manufacturing, performed in a region corresponding to FIG. 3.

Figure 5A:
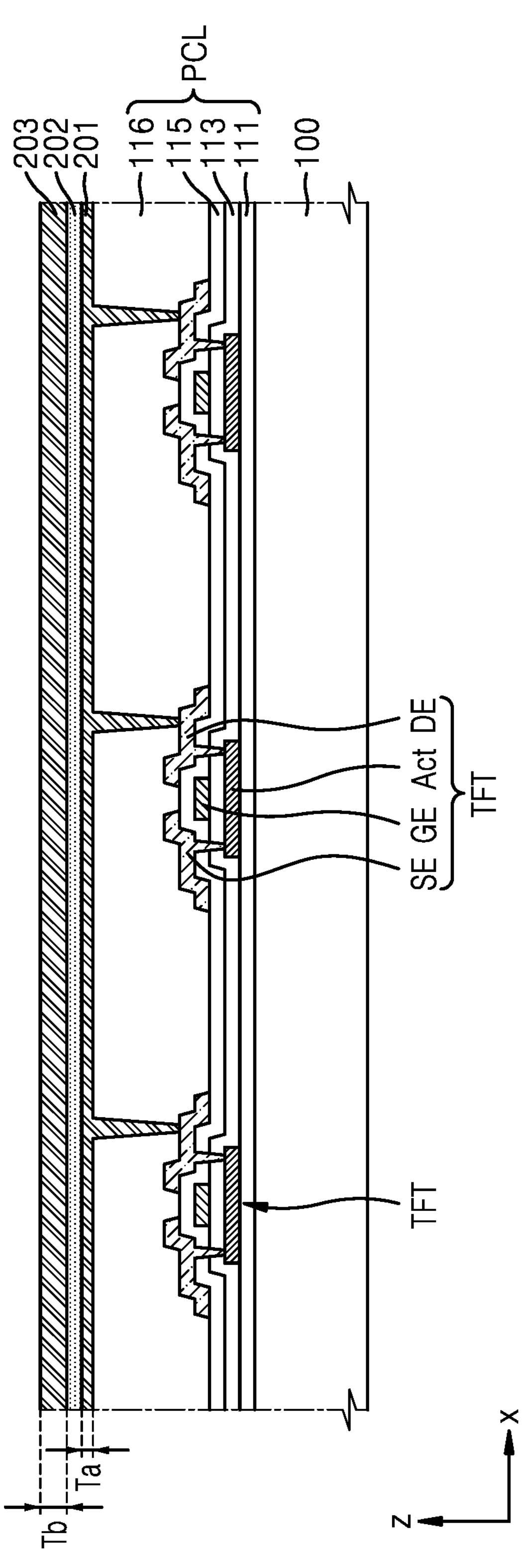

Referring to FIG. 5A, the substrate 100 may be prepared, and the pixel circuit layer PCL including the thin-film transistor TFT may be provided or formed on the substrate 100. The pixel circuit layer PCL may include a plurality of insulating layers including the buffer layer 111, the gate insulating layer 113, the interlayer insulating layer 115, and the via insulating layer 116. Next, a lower conductive layer 201 on the pixel circuit layer PCL, an intermediate conductive layer 202 on the lower conductive layer 201, and an upper conductive layer 203 on the intermediate conductive layer 202 may be sequentially formed.

The lower conductive layer 201, the intermediate conductive layer 202, and the upper conductive layer 203 may be deposited by, for example, a sputtering deposition process.

In an embodiment, the lower conductive layer 201 may be formed of a same material as the upper conductive layer 203 to simplify the process. The lower conductive layer 201 may include an amorphous metal material. The lower conductive layer 201 may include a metal material having an amorphous state at a temperature of about 250° C. or less. In an embodiment, for example, the lower conductive layer 201 may include Zn-doped ITO. In an embodiment, in the Zn-doped ITO, an atomic ratio of tin (Sn) may be in a range of about 15 at % to about 25 at %, and a composition ratio of indium (In) to zinc (Zn) may be about 1:1.

In an embodiment, for example, the intermediate conductive layer 202 may include silver (Ag), magnesium (Mg), aluminum (Al), platinum (Pt), palladium (Pd), gold (Au), nickel (Ni), neodymium (Nd), iridium (Ir), chromium (Cr), or a compound thereof.

A thickness Tb of the upper conductive layer 203 may be greater than a thickness Ta of the lower conductive layer 201. The thickness Tb of the upper conductive layer 203 may be in a range of about 500 Å to about 2000 Å. If the thickness Tb of the upper conductive layer 203 is greater than the above range, the forming process thereof may not be easy. If the thickness Tb of the upper conductive layer 203 is smaller than the above range, it may be difficult to secure an appropriate resonance distance, and thus the manufacturing process may not be effectively simplified by reducing the number of FMM mask processes.

The upper conductive layer 203 may include an amorphous metal material. The upper conductive layer 203 may include a metal material having an amorphous state at a temperature of about 250° C. or less. The upper conductive layer 203 may include, for example, Zn-doped ITO in an amorphous state. In an embodiment, in the Zn-doped ITO, the atomic ratio of tin (Sn) may be in a range of about 15 at % to about 25 at %, and the composition ratio of indium (In) to zinc (Zn) may be about 1:1.

The lower conductive layer 201 may be a preliminary lower layer, a portion of which is to be a lower layer of a pixel electrode by a subsequent process, and the intermediate conductive layer 202 may be a preliminary intermediate layer, a portion of which is to be an intermediate layer of the pixel electrode by a subsequent process, and the upper conductive layer 203 may be a preliminary upper layer, a portion of which is to be an upper layer of the pixel electrode by a subsequent process.

Figure 5B:
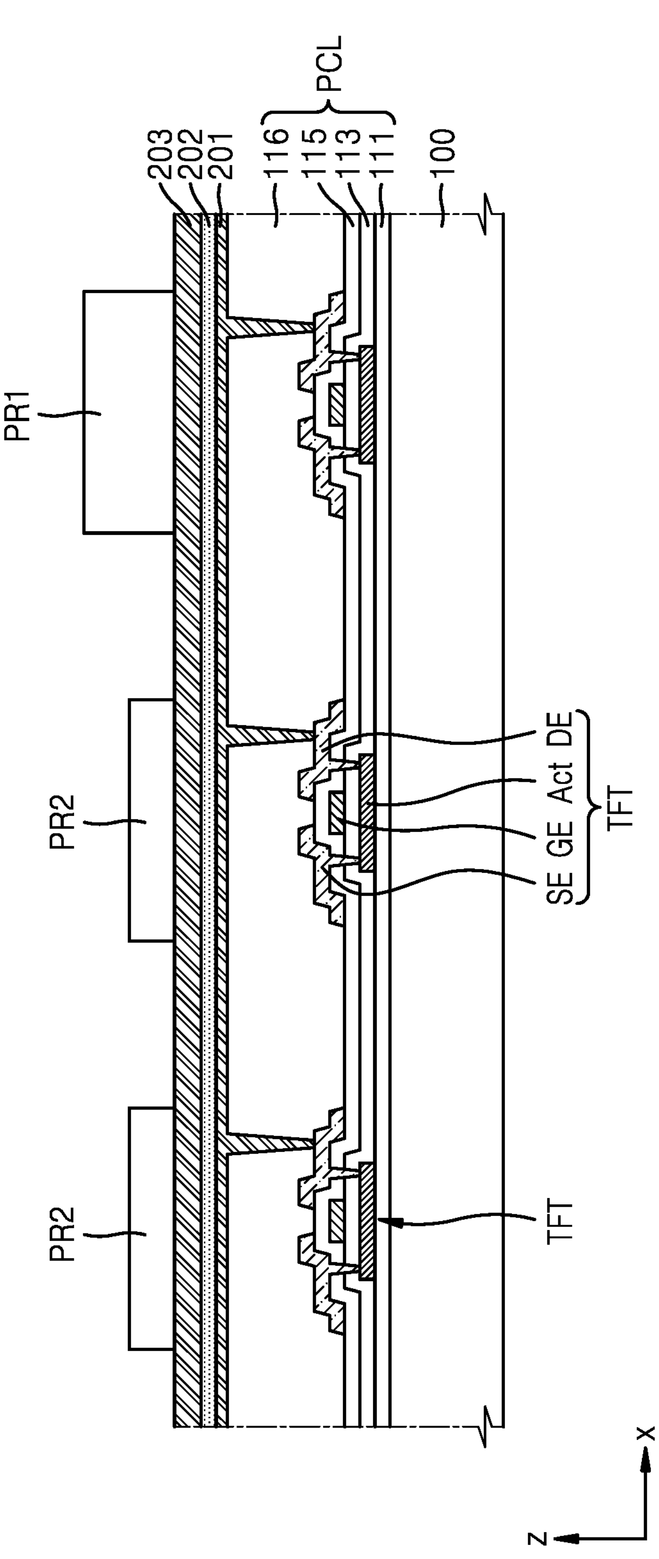

Referring to FIG. 5B, a first photoresist pattern PR1 and a second photoresist pattern PR2 having a thickness less than that of the first photoresist pattern PR1 may be formed on the upper conductive layer 203. The first photoresist pattern PR1 may be formed on an area corresponding to an area where the first pixel electrode 210*a* of FIG. 3 is disposed, and the second photoresist pattern PR2 may be formed on areas corresponding to areas where the second pixel electrode 210*b* and the third pixel electrode 210*c* are respectively disposed. The first photoresist pattern PR1 and the second photoresist pattern PR2 having different thicknesses from each other may be formed by a photolithography process using a halftone mask.

Figure 5C:
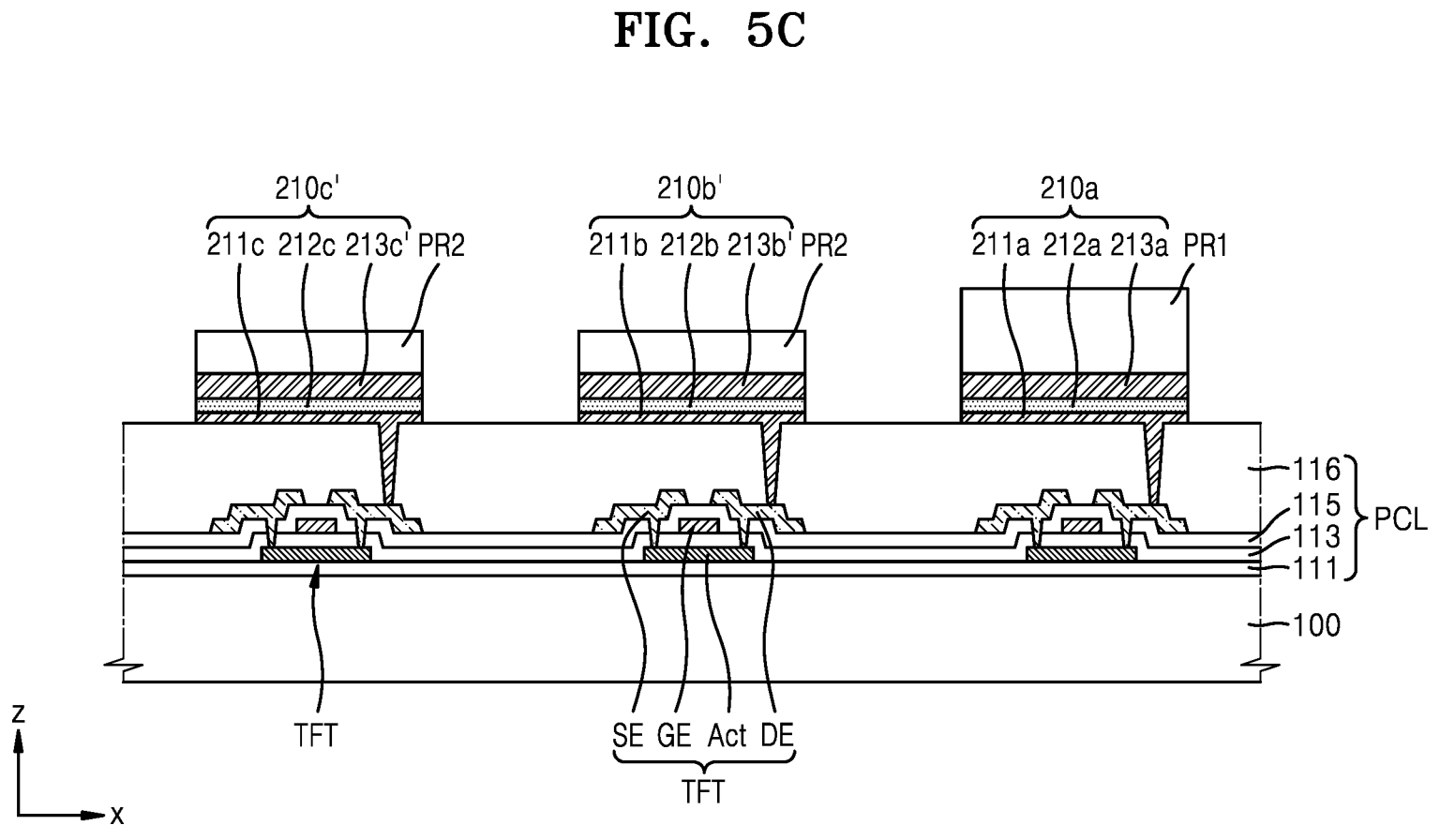

Referring to FIG. 5C, the lower conductive layer 201, the intermediate conductive layer 202, and the upper conductive layer 203 may be etched using the first photoresist pattern PR1 and the second photoresist pattern PR2. The process of etching the lower conductive layer 201, the intermediate conductive layer 202, and the upper conductive layer 203 may be, for example, a wet etching process, but is not limited thereto.

By etching the lower conductive layer 201, the intermediate conductive layer 202, and the upper conductive layer 203, the first pixel electrode 210*a* including the first lower layer 211*a*, the first intermediate layer 212*a*, and the first upper layer 213*a* may be formed. By etching the lower conductive layer 201, the intermediate conductive layer 202, and the upper conductive layer 203, a first preliminary pixel electrode 210*b*' including the second lower layer 211*b*, the second intermediate layer 212*b*, and a first preliminary upper layer 213*b*' may be formed. By etching the lower conductive layer 201, the intermediate conductive layer 202, and the upper conductive layer 203, a second preliminary pixel electrode 210*c*' including the third lower layer 211*c*, the third intermediate layer 212*c*, and a second preliminary layer 213*c*' may be formed.

As the upper conductive layer 203 includes a metal material which is in an amorphous state, even when the upper conductive layer 203 is thick, it is possible to effectively prevent or substantially reduce the occurrence of defective residues in the etching process.

Figure 5D:
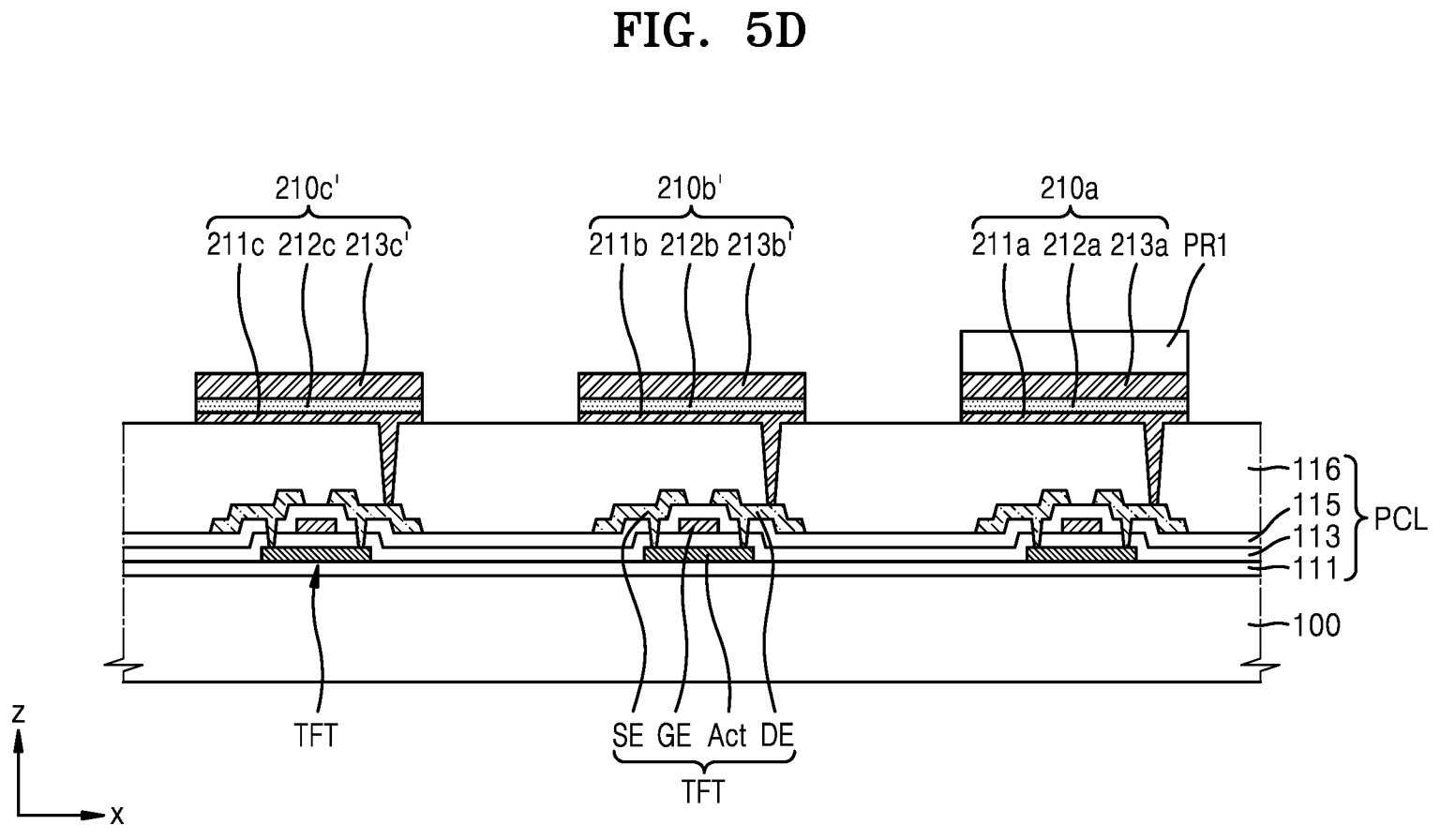

Referring to FIG. 5D, a portion of the first photoresist pattern PR1, and the second photoresist pattern PR2 may be removed. A portion of the first photoresist pattern PR1 and the whole of the second photoresist pattern PR2 may be removed by an ashing process. As the first photoresist pattern PR1 is thick, the first photoresist pattern PR1 on the first pixel electrode 210*a* may remain. By removing the second photoresist pattern PR2, upper surfaces of the first preliminary pixel electrode 210*b*' and the second preliminary pixel electrode 210*c*' may be exposed.

Figure 5E:
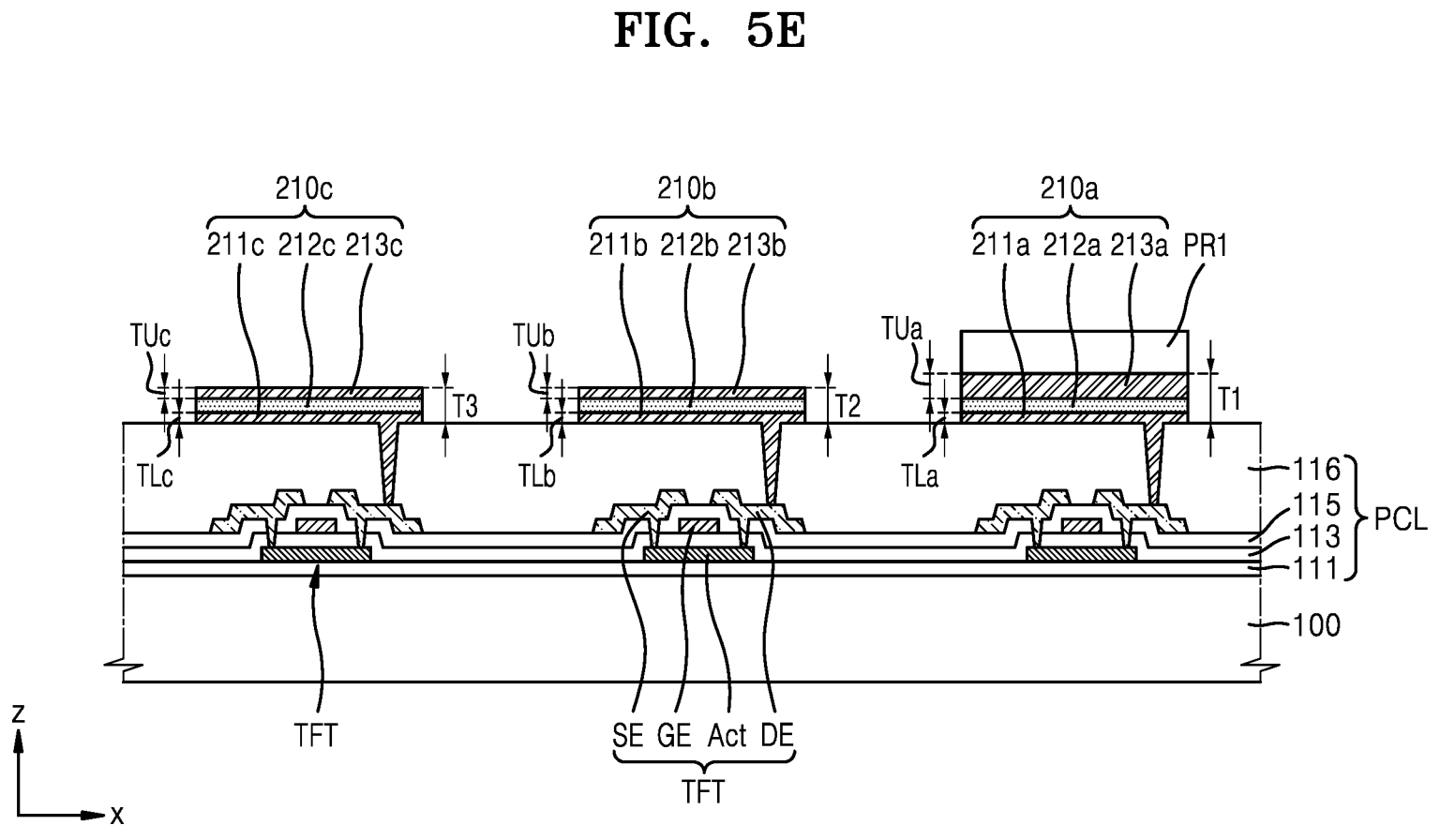

Referring to FIG. 5E, a portion of each of the first preliminary upper layer 213*b*' of the first preliminary pixel electrode 210*b*' and the second preliminary upper layer 213*c*' of the second preliminary pixel electrode 210*c*' may be partially etched to form the second pixel electrode 210*b* and the third pixel electrode 210*c*, respectively. The process of etching the first preliminary upper layer 213*b*' and the second preliminary upper layer 213*c*' may be, for example, a wet etching process, but is not limited thereto.

By etching a portion of the first preliminary pixel electrode 210*b*' and a portion of the second preliminary pixel electrode 210*c*', the second pixel electrode 210*b* and the third pixel electrode 210*c* each having a less thickness than the thickness T1 of the first pixel electrode 210*a* may be formed. The thickness T2 of the second pixel electrode 210*b* may be less than the thickness T1 of the first pixel electrode 210*a*. The thickness T3 of the third pixel electrode 210*c* may be less than the thickness T1 of the first pixel electrode 210*a*.

By etching a portion of the preliminary upper layer 213*b*' of the first preliminary pixel electrode 210*b*', the second upper layer 213*b* may be formed. Accordingly, the second pixel electrode 210*b* including the second lower layer 211*b*, the second intermediate layer 212*b*, and the second upper layer 213*b* may be formed. By etching a portion of the second preliminary upper layer 213*c*' of the second preliminary pixel electrode 210*c*', the third upper layer 213*c* may be formed. Accordingly, the third pixel electrode 210*c* including the third lower layer 211*c*, the third intermediate layer 212*c*, and the third upper layer 213*c* may be formed.

The thickness Tub of the second upper layer 213*b* and the thickness TUc of the third upper layer 213*c* may be less than the thickness TUa of the first upper layer 213*a*. The thickness Tub of the second upper layer 213*b* may be in a range, for example, from about 50 Å to about 200 Å. If the thickness Tub of the second upper layer 213*b* and the thickness TUc of the third upper layer 213*c* are greater than the above range, it may be difficult to secure an appropriate resonance distance. If the thickness Tub of the second upper layer 213*b* and the thickness TUc of the third upper layer 213*c* are less than the above range, the forming process thereof may not be easy.

The thickness TUb of the second upper layer 213*b* and the thickness TUc of the third upper layer 213*c* may be each less than the thickness TUa of the first upper layer 213*a*. Accordingly, a resonance distance between the first to third intermediate layers 212*a*, 212*b*, and 212*c* and the opposite electrode 230 (see FIG. 3) may be varied, thereby reducing the number of FMM processes.

Figure 5F:
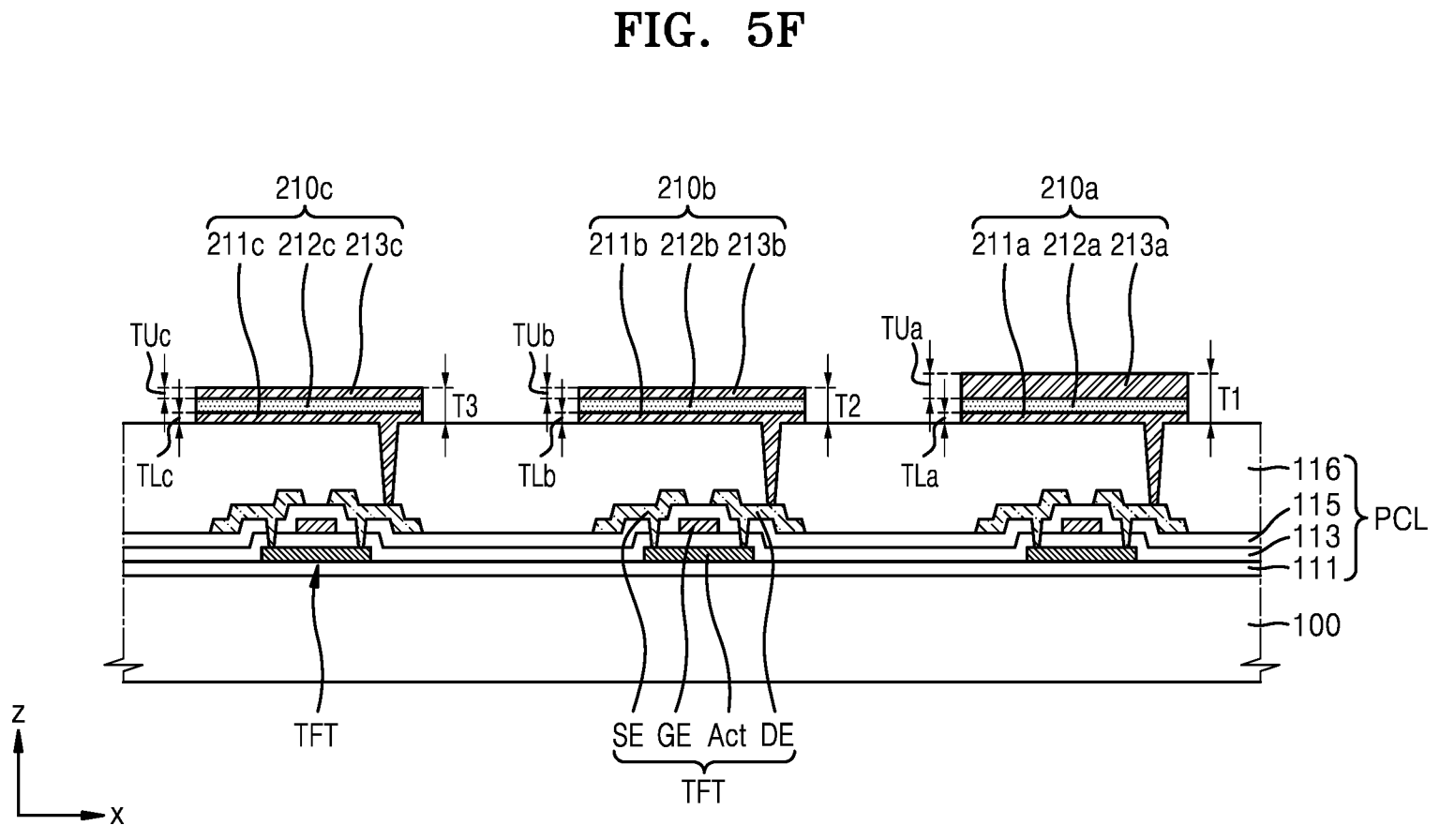

Referring to FIG. 5F, a portion of the remaining portions of the first photoresist pattern PR1 may be removed. The first photoresist pattern PR1 may be removed using an ashing process.

Referring back to FIG. 3, the pixel-defining layer 120 may be provided or formed on the first to third pixel electrodes 210*a*, 210*b*, and 210*c*. The opening 120OP exposing at least a portion of the first to third pixel electrodes 210*a*, 210*b*, and 210*c* may be formed in the pixel-defining layer 120. The first to third emission layers 220*a*, 220*b*, and 220*c* may be provided or formed on the first to third pixel electrodes 210*a*, 210*b*, and 210*c*, respectively, and the opposite electrode 230 may be provided or formed on the first to third emission layers 220*a*, 220*b*, and 220*c* to entirely cover the substrate 100.

According to an embodiment, a high-resolution display device may be provided by including pixel electrodes having relatively different thicknesses. In such an embodiment, an uppermost layer of the pixel electrodes may include an amorphous metal, and thus, even the upper layer is relatively thick, the occurrence of residues due to an etching process may be effectively prevented or substantially reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a substrate;

a pixel circuit layer disposed on the substrate and including a thin-film transistor;

a first pixel electrode disposed on the pixel circuit layer, and including a first lower layer, a first intermediate layer and a first upper layer;

a second pixel electrode disposed on the pixel circuit layer, and including a second lower layer, a second intermediate layer and a second upper layer;

an opposite electrode disposed on the first pixel electrode and the second pixel electrode;

a first emission layer disposed between the first pixel electrode and the opposite electrode; and a second emission layer disposed between the second pixel electrode and the opposite electrode, wherein a thickness of the first upper layer is greater than a thickness of the second upper layer, and the first upper layer comprises an amorphous metal material having an amorphous state at a temperature of about 250° C.

2. The display device of claim 1, wherein the amorphous metal material comprises zinc-doped indium tin oxide.

3. The display device of claim 2, wherein, in the zinc-doped indium tin oxide, an atomic ratio of tin (Sn) is in a range of about 15 at % to about 25 at %, and a composition ratio of indium (In) to zinc (Zn) is about 1:1.

4. The display device of claim 1, wherein the amorphous metal material maintains the amorphous state at a temperature of about 250° C. or less.

5. The display device of claim 1, wherein the second upper layer comprises a same material as a material of the first upper layer, and the second lower layer comprises a same material as a material of the first lower layer.

6. The display device of claim 1, wherein the first lower layer comprises the amorphous metal material.

7. The display device of claim 1, wherein the thickness of the first upper layer is greater than a thickness of the first lower layer.

8. The display device of claim 1, wherein a thickness of the first lower layer is equal to a thickness of the second lower layer.

9. The display device of claim 1, wherein the thickness of the first upper layer is in a range of about 500 Å to about 2000 Å.

10. The display device of claim 1, wherein a thickness of the first lower layer is in a range of about 50 Å to about 200 Å.

11. The display device of claim 1, wherein the thickness of the second upper layer is in a range of about 50 Å to about 200 Å.

12. A display device comprising:

a substrate;

a pixel circuit layer disposed on the substrate and including a thin-film transistor;

a first pixel electrode and a second pixel electrode which are disposed on the pixel circuit layer, wherein the first pixel electrode has a first thickness, and the second pixel electrode has a second thickness less than the first thickness;

an opposite electrode disposed on the first pixel electrode and the second pixel electrode; and a first emission layer disposed between the first pixel electrode and the opposite electrode; and a second emission layer disposed between the second pixel electrode and the opposite electrode, wherein each of the first pixel electrode and the second pixel electrode comprises an amorphous metal material having an amorphous state at a temperature of about 250° C.

13. The display device of claim 12, wherein the amorphous metal material comprises zinc-doped indium tin oxide.

14. The display device of claim 13, wherein, in the zinc-doped indium tin oxide, an atomic ratio of tin (Sn) is in a range of about 15 at % to about 25 at %, and a composition ratio of indium (In) to zinc (Zn) is about 1:1.

15. The display device of claim 12, wherein each of the first pixel electrode and the second pixel electrode comprises a lower layer, an intermediate layer disposed on the lower layer and comprising silver (Ag), and an upper layer disposed on the intermediate layer and comprising the amorphous metal material.

16. The display device of claim 15, wherein a thickness of the upper layer of the first pixel electrode is greater than a thickness of the upper layer of the second pixel electrode.

17. A method of manufacturing a display device, the method comprising:

forming a lower conductive layer on a substrate, an intermediate conductive layer on the lower conductive layer, and an upper conductive layer on the intermediate conductive layer, wherein the upper conductive layer is thicker than the lower conductive layer;

forming a first photoresist pattern and a second photoresist pattern on the upper conductive layer, wherein the second photoresist pattern has a less thickness than the first photoresist pattern;

forming a first pixel electrode and a preliminary pixel electrode by etching the lower conductive layer, the intermediate conductive layer and the upper conductive layer using the first photoresist pattern and the second photoresist pattern as a mask, wherein the first pixel electrode includes a first lower layer defined by a portion of the lower conductive layer, a first intermediate layer defined by a portion of the intermediate conductive layer, and a first upper layer defined by a portion of the upper conductive layer, and a preliminary pixel electrode includes a second lower layer defined by a portion of the lower conductive layer, a second intermediate layer defined by a portion of the intermediate conductive layer, and a preliminary upper layer defined by a portion of the upper conductive layer;

removing a partial portion of the first photoresist pattern, and an entire portion of the second photoresist pattern;

forming a second pixel electrode by partially etching the preliminary upper layer of the preliminary pixel electrode; and removing a remaining portion of the first photoresist pattern, wherein the first upper layer comprises an amorphous metal material having an amorphous state at a temperature of about 250° C.

18. The method of claim 17, wherein the upper conductive layer comprises zinc-doped indium tin oxide.

19. The method of claim 18, wherein, in the zinc-doped indium tin oxide, an atomic ratio of tin (Sn) is in a range of about 15 at % to about 25 at %, and a composition ratio of indium (In) to zinc (Zn) is about 1:1.

* * * * *